(12) United States Patent
Bai et al.

(10) Patent No.: US 12,183,230 B2
(45) Date of Patent: Dec. 31, 2024

(54) DISPLAY SUBSTRATE, DETECTION METHOD THEREFOR, AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Lu Bai, Beijing (CN); Pengfei Yu, Beijing (CN); Yi Zhang, Beijing (CN); Sen Du, Beijing (CN); Tingliang Liu, Beijing (CN); Li Song, Beijing (CN); Huijuan Yang, Beijing (CN); Xiaofeng Jiang, Beijing (CN); Yu Wang, Beijing (CN)

(73) Assignees: Beijing BOE Technology Development Co., Ltd., Beijing (CN); Chengdu BOE Optoelectronics Technology Co., Ltd., Sichuan Province (CN)

( * ) Notice: Subject to any disclaimer, the term of this patent is extended or adjusted under 35 U.S.C. 154(b) by 0 days.

(21) Appl. No.: 18/250,456

(22) PCT Filed: Oct. 27, 2020

(86) PCT No.: PCT/CN2020/124111
§ 371 (c)(1),
(2) Date: Apr. 25, 2023

(87) PCT Pub. No.: WO2022/087844
PCT Pub. Date: May 5, 2022

(65) Prior Publication Data
US 2023/0410704 A1    Dec. 21, 2023

(51) Int. Cl.
*G09G 3/00*    (2006.01)
*H10K 59/131*    (2023.01)

(52) U.S. Cl.
CPC .......... *G09G 3/006* (2013.01); *H10K 59/131* (2023.02); *G09G 2300/0408* (2013.01);
(Continued)

(58) Field of Classification Search
CPC ............... G09G 3/006; G09G 2330/12; G09G 2300/0426; G09G 2380/02;
(Continued)

(56) References Cited

U.S. PATENT DOCUMENTS

| 2014/0176844 | A1 | 6/2014 | Yanagisawa |
| 2015/0022211 | A1* | 1/2015 | Du .......................... G09G 3/006 324/414 |

(Continued)

FOREIGN PATENT DOCUMENTS

| CN | 105393165 A | 3/2016 |
| CN | 105679215 A | 6/2016 |

(Continued)

OTHER PUBLICATIONS

International Search Report and Written Opinion, mailed Jul. 7, 2021, from PCT/CN2020/124111, 13 pages.

*Primary Examiner* — Dismery Mercedes
(74) *Attorney, Agent, or Firm* — Workman Nydegger

(57) ABSTRACT

A display substrate, a detection method, and a display device. The display substrate includes: a substrate, including a display region and a peripheral region surrounding the display region; multiple subpixels, multiple data lines, arranged in the display region; a first control signal line, a second control signal line, a crack detection line, and at least one data detection line, arranged in the peripheral region, and the crack detection line is provided around the display region; multiple display screen detection units, arranged in the peripheral region, configured to transmit, according to a control signal provided by the first control signal line, a
(Continued)

detection signal provided by the at least one data detection line to at least one of the multiple data lines; multiple crack detection units, arranged in the peripheral region.

12 Claims, 4 Drawing Sheets

(52) U.S. Cl.
CPC .............. *G09G 2300/0426* (2013.01); *G09G 2310/0202* (2013.01); *G09G 2330/04* (2013.01); *G09G 2330/10* (2013.01); *G09G 2330/12* (2013.01)

(58) Field of Classification Search
CPC ... G09G 2300/0413; G09G 2300/0408; G09G 2330/08; G09G 2330/10; G09G 3/3677; G09G 3/2092; G09G 3/3266; G09G 3/3291; G09G 2330/04; H10K 59/131; H10K 59/40; H10K 71/70; H10K 59/1213; H10K 59/00; H01L 22/32; H01L 27/124
See application file for complete search history.

(56) References Cited

U.S. PATENT DOCUMENTS

| | | | |
|---|---|---|---|
| 2016/0043010 A1* | 2/2016 | Kwak ................. | H10K 77/111 438/15 |
| 2016/0225312 A1 | 8/2016 | Byun et al. | |
| 2016/0351093 A1* | 12/2016 | Kim ..................... | G09G 3/2092 |
| 2016/0372017 A1* | 12/2016 | Byun ...................... | G09G 3/20 |
| 2017/0199439 A1 | 7/2017 | Jia et al. | |
| 2017/0270842 A1* | 9/2017 | Nam ..................... | H01L 27/124 |
| 2017/0337859 A1* | 11/2017 | Hirata .................... | G09G 3/006 |
| 2018/0033354 A1* | 2/2018 | Lee ........................ | G09G 3/006 |
| 2018/0047804 A1* | 2/2018 | Zhou ..................... | G09G 3/2092 |
| 2018/0182274 A1* | 6/2018 | Jung ..................... | G09G 3/006 |
| 2018/0350284 A1* | 12/2018 | Park ...................... | G09G 3/006 |
| 2019/0057632 A1* | 2/2019 | Kim ..................... | G09G 3/3266 |
| 2020/0025820 A1* | 1/2020 | Zhao ..................... | G09G 3/3225 |
| 2020/0066196 A1 | 2/2020 | Hao et al. | |
| 2020/0135595 A1* | 4/2020 | Kim ...................... | H01L 22/32 |
| 2020/0242986 A1* | 7/2020 | Lee ....................... | G06F 1/1652 |
| 2020/0388664 A1 | 12/2020 | Cheng et al. | |
| 2021/0090480 A1 | 3/2021 | Sun et al. | |
| 2021/0248938 A1 | 8/2021 | Lee et al. | |
| 2022/0003810 A1 | 1/2022 | Ye | |

FOREIGN PATENT DOCUMENTS

| | | |
|---|---|---|
| CN | 108417561 A | 8/2018 |
| CN | 108922909 A | 11/2018 |
| CN | 108986728 A | 12/2018 |
| CN | 109142447 A | 1/2019 |
| CN | 109345985 A | 2/2019 |
| CN | 110503907 A | 11/2019 |
| CN | 110608871 A | 12/2019 |
| CN | 110648618 A | 1/2020 |
| CN | 110853558 A | 2/2020 |
| CN | 110858603 A | 3/2020 |
| CN | 111785658 A | 10/2020 |
| WO | 2019235823 A1 | 12/2019 |

\* cited by examiner

| at a crack detection stage of the display substrate: a first control signal line receives a first level signal, to control the at least one of the plurality of display screen detection elements to be switched off; a second control signal line receives a second level signal, to control the at least one of the plurality of crack detection elements to be switched on; if a crack detection line is not broken, a detection signal on the crack detection line is transmitted to a corresponding data line through the at least one of the plurality of crack detection elements and output to light-emitting elements in subpixels connected with the corresponding data line through the corresponding data line, and the light-emitting elements electrically connected with the data lines are in a dark state; and if the crack detection line is broken, the detection signal on the crack detection line cannot be transmitted to the light-emitting elements in the subpixels, and the light-emitting elements electrically connected with the corresponding data line emit light | S401 |

| at a display screen detection stage: the first control signal line receives the second level signal, to control the at least one of the plurality of display screen detection elements to be switched on; the second control signal line receives the first level signal, to control the at least one of the plurality of crack detection elements to be switched off; and a detection signal of at least one data detection line is transmitted to the corresponding data line through the at least one of the plurality of display screen detection elements, and the light-emitting elements in the subpixels electrically connected with the data lines emit light | S402 |

Fig. 4

DISPLAY SUBSTRATE, DETECTION METHOD THEREFOR, AND DISPLAY DEVICE

CROSS REFERENCE TO RELATED APPLICATIONS

The present disclosure is a national phase entry under 35 U.S.C § 371 of International Application No. PCT/CN2020/124111, filed Oct. 27, 2020, and entitled "DISPLAY SUBSTRATE, DETECTION METHOD THEREFOR, AND DISPLAY DEVICE".

FIELD

The present disclosure relates to the technical field of display, in particular to a display substrate, a detection method therefor, and a display apparatus.

BACKGROUND

With the continuous innovation of the display technology, flexible organic light-emitting diodes (OLEDs) have been the most popular in recent years, and are applied more and more extensively. Although the flexible OLEDs have many advantages, edges of flexible products are prone to generating cracks, and the cracks will cause problems of packaging invalidation or display abnormity in the subsequent manufacturing process. Therefore, it is very necessary to design a circuit for detecting cracks of flexible display panels and a detection method based on the circuit.

SUMMARY

Embodiments of the present disclosure provide a display substrate, including:
  a substrate, including a display region and a peripheral region surrounding the display region;
  a plurality of subpixels, located in the display region;
  a plurality of data lines, located in the display region, and electrically connected with the plurality of subpixels;
  a first control signal line, located in the peripheral region;
  a second control signal line, located in the peripheral region;
  a crack detection line, located in the peripheral region, and arranged to surround the display region;
  at least one data detection line, located in the peripheral region;
  a plurality of display screen detection elements, located in the peripheral region; at least one of the plurality of display screen detection elements is electrically connected with the first control signal line, the at least one data detection line and at least one of the plurality of data lines, and configured to transmit a detection signal provided by the at least one data detection line to at least one of the plurality of data lines according to a control signal provided by the first control signal line; and
  a plurality of crack detection elements, located in the peripheral region; at least one of the plurality of crack detection elements is electrically connected with the crack detection line, the second control signal line and at least one of the plurality of data lines.

Optionally, in the above display substrate provided by the embodiments of the present disclosure, the plurality of data lines include a first data line, a second data line and a third data line, and at least one of the plurality of crack detection elements is electrically connected with one of the first data line, the second data line and the third data line.

Optionally, the above display substrate provided by the embodiments of the present disclosure further includes a test line located in the peripheral region, and at least one of the plurality of crack detection elements is electrically connected with the crack detection line, the test line, the second control signal line, the first data line, the second data line and the third data line; and
  the at least one of the plurality of crack detection elements is configured to transmit a test signal provided by the test line to at least one of the plurality of data lines according to a control signal provided by the second control signal line.

Optionally, in the above display substrate provided by the embodiments of the present disclosure, the at least one data detection line includes a first data detection line, a second data detection line and a third data detection line, and at least one of the plurality of display detection elements is electrically connected with one of the first data detection line, the second data detection line and the third data detection line; and
  the at least one of the plurality of display detection elements is configured to transmit detection signals provided by the first data detection line, the second data detection line or the third data detection line to a corresponding data line according to a control signal provided by the first control signal line.

Optionally, in the above display substrate provided by the embodiments of the present disclosure, at least one of the plurality of display screen detection elements is electrically connected with the first data detection line, the second data detection line and the third data detection line.

Optionally, in the above display substrate provided by the embodiments of the present disclosure, at least one of the plurality of display screen detection elements includes a first transistor, a second transistor and a third transistor;
  a control electrode of the first transistor, a control electrode of the second transistor and a control electrode of the third transistor are all electrically connected with the first control signal line;
  a first electrode of the first transistor is electrically connected with the first data detection line, a first electrode of the second transistor is electrically connected with the second data detection line, and a first electrode of the third transistor is electrically connected with the third data detection line; and
  a second electrode of the first transistor, a second electrode of the second transistor and a second electrode of the third transistor are electrically connected with a respective one of the data lines respectively.

Optionally, in the above display substrate provided by the embodiments of the present disclosure, at least one of the crack detection elements at least includes a first transistor, a second transistor and a third transistor;
  a control electrode of the first transistor, a control electrode of the second transistor and a control electrode of the third transistor in each crack detection element are all electrically connected with the second control signal line;
  a first electrode of the first transistor, a first electrode of second transistor and a first electrode of the third transistor in each crack detection element are electrically connected with a respective one of the plurality of data lines respectively; and
  a second electrode of the second transistor in at least one of the plurality of crack detection elements is electrically connected with the crack detection line, and a second electrode of the first transistor and a second electrode of the second transistor are electrically connected with the test line; and second electrodes of first transistors, second electrodes of second transistors and second electrodes of third transistors in the remaining crack detection elements are all electrically connected with the test line.

Optionally, the above display substrate provided by the embodiments of the present disclosure further includes a plurality of bonding pads located in the peripheral region; the plurality of display screen detection elements are located at opposite sides of the plurality of binding bonding pads, and the plurality of display screen detection elements and the plurality of binding bonding pads are located at opposite sides of the display region; and the plurality of crack detection elements are located at the opposite sides of the plurality of binding bonding pads, and the plurality of crack detection elements and the plurality of bonding pads are located at opposite sides of the display region.

Optionally, in the above display substrate provided by the embodiments of the present disclosure, the plurality of crack detection elements are arranged to surround the display region, the plurality of display screen detection elements are arranged to surround the display region, and the plurality of crack detection elements are located between the plurality of display screen detection elements and the display region.

Optionally, the above display substrate provided by the embodiment of the present disclosure further includes a plurality of bonding pads located in the peripheral region, and the crack detection line and the test line are led out from the same bonding pad.

Optionally, in the above display substrate provided by the embodiments of the present disclosure, the test line is directly arranged to surround the display region after being led out from the binding bonding pads, and the crack detection line surrounds an edge of the display substrate and the display region after being led out from the bonding pads.

Optionally, in the above display substrate provided by the embodiments of the present disclosure, the second control signal line, the at least one data detection line and the first control signal line are led out from a respective one of the bonding pads respectively and are arranged to surround the display region.

Optionally, in the above display substrate provided by the embodiments of the present disclosure, in a direction of the display region pointing to the peripheral region, the at least one data detection line, the first control signal line, the second control signal line, the test line and the crack detection line are sequentially arranged.

Accordingly, the embodiments of the present disclosure further provide a display apparatus, including the above display substrate provided by the embodiments of the present disclosure.

Accordingly, the embodiments of the present disclosure further provide a detection method of a display substrate, including:

at a crack detection stage of the display substrate: receiving, by a first control signal line, a first level signal, to control the at least one of the plurality of display screen detection elements to be switched off; receiving, by a second control signal line, a second level signal, to control the at least one of the plurality of crack detection elements to be switched on; if a crack detection line is not broken, transmitting a detection signal on the crack detection line to a corresponding data line through the at least one of the plurality crack detection elements, and outputting the detection signal to light-emitting elements in subpixels connected with the corresponding data line through the corresponding data line, so that the light-emitting elements electrically connected with the corresponding data line are in a dark state; and if the crack detection line is broken, not transmitting the detection signal on the crack detection line to the light-emitting elements in the subpixels, so that the light-emitting elements electrically connected with the corresponding data line emit light; and at a display screen detection stage: receiving, by the first control signal line, the second level signal, to control the at least one of the plurality of display screen detection elements to be switched on; receiving, by the second control signal line, the first level signal, to control the at least one of the plurality of crack detection elements to be switched off; and transmitting the detection signal of the at least one data detection line to the corresponding data line through the at least one of the plurality of display screen detection elements, so that the light-emitting elements in the subpixels electrically connected with the data lines emit light.

BRIEF DESCRIPTION OF THE DRAWINGS

FIG. 4 is a flow diagram of a detection method of a display substrate provided by an embodiment of the present disclosure.

DETAILED DESCRIPTION OF THE EMBODIMENTS

Figure 1:
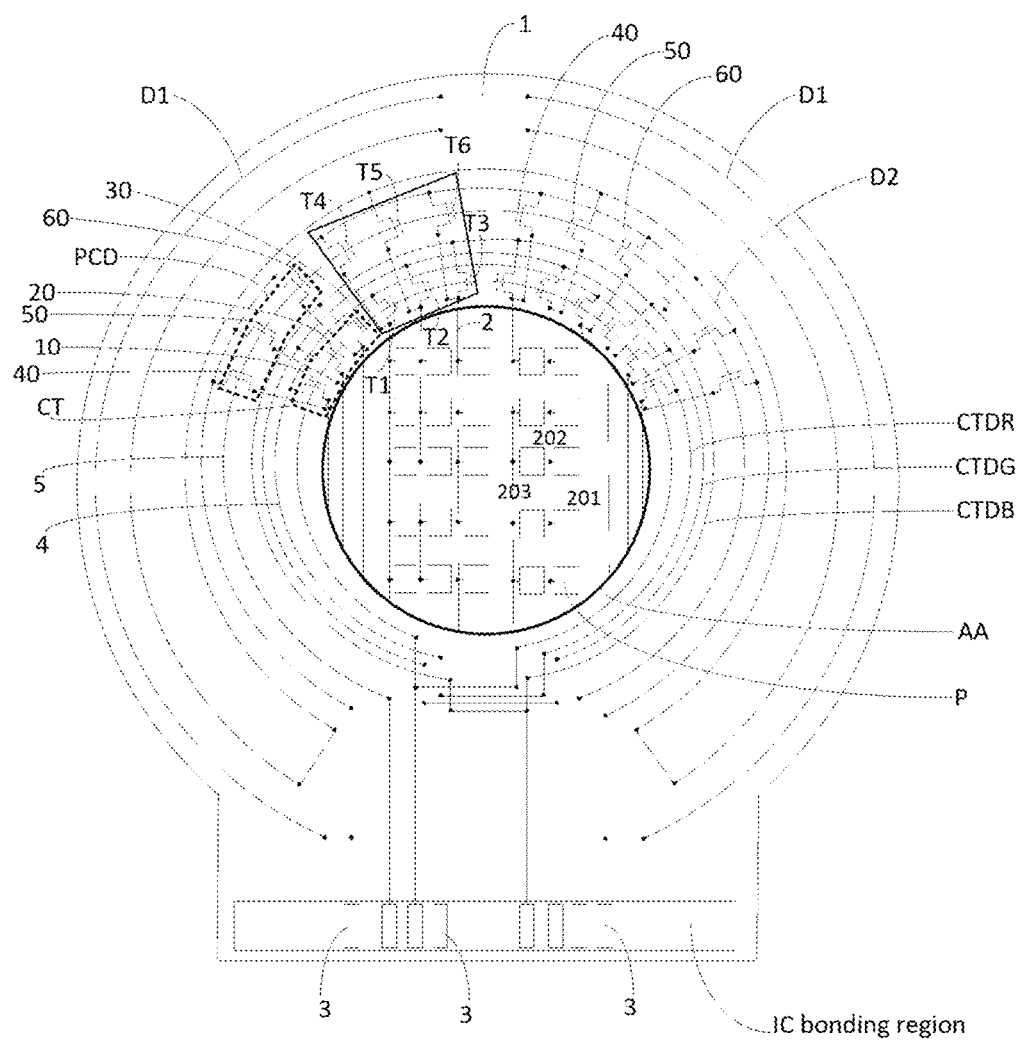
FIG. 1 is an overlook schematic structural diagram of part of film layers of a display substrate provided by an embodiment of the present disclosure.

In order to make objectives, technical solutions and advantages of the embodiments of the present disclosure clearer, the technical solutions of the embodiments of the present disclosure will be clearly and completely described below with reference to the accompanying drawings of the embodiments of the present disclosure. Apparently, the described embodiments are some, but not all of the embodiments of the present disclosure. In addition, the embodiments of the present disclosure and features in the embodiments may be combined with each other without conflict. Based on the described embodiments in the present disclosure, all other embodiments obtained by those of ordinary skill in the art without creative work shall fall within the protection scope of the present disclosure.

Unless otherwise defined, technical or scientific terms used herein should have the ordinary meanings as understood by those of ordinary skill in the art to which the present disclosure pertains. "Comprise" or "include" and similar words mean that the elements or objects appearing before the words cover the elements or objects recited after the words and their equivalents, but do not exclude other elements or objects. "Connect" or "link" and similar words are not limited to physical or mechanical connection, but may include electrical connection, whether direct or indirect. "Inner", "outer", "up", "down" and the like are merely used to represent a relative position relationship, and after an absolute position of a described object is changed, the relative position relationship may also be changed accordingly.

It needs to be noted that sizes and shapes of all figures in the accompanying drawings do not reflect true scales, and are only intended to schematically illustrate the content of the present disclosure. The same or similar reference numerals represent the same or similar elements or elements with the same or similar functions all the time.

Display panels need to be cut into a required size through a cutting process, under the influence of the cutting process, marginal regions of the display panels are prone to forming some cracks, in the subsequent process and the using process of products, the cracks are likely to extend to interiors of the display panels, which affects normal display of the display panels. Therefore, before delivery of the display panels, panel crack detection (PCD) is required; and in addition, before delivery, display panels further need a cell test (CT), and the CT refers to detect whether the display panels display a pure color picture. At present, the PCD and the CT are achieved by adopting the same detection circuit, since resistance differences of signal lines are larger during different kinds of detection, which may cause uneven picture brightness on a screen, and the problem of mutual interference of detection is caused.

Based on this, embodiments of the present disclosure provide a display substrate, as shown in FIG. 1, including following elements.

A substrate 1, including a display region AA and a peripheral region surrounding the display region AA; the substrate 1 may be a flexible substrate or a rigid substrate, a middle part of the substrate 1 is the display region AA for displaying, a periphery of the display region AA is the peripheral region provided with other structures, and the display region AA is used for displaying images.

A plurality of subpixels P, located in the display region AA, the display region AA in FIG. 1 merely illustrating part of subpixels P; each subpixel P is provided with a pixel circuit, the pixel circuit is used for driving the subpixel P to emit light, the pixel circuit may be 2T1C, 7T1C and other circuit structures.

A plurality of data lines 2, located in the display region AA, electrically connected with the plurality of subpixels P, and configured to provide data signals to the plurality of subpixels P; the plurality of data lines 2 and a plurality of grid lines (not shown) are insulated and crossed to define the plurality of subpixels P, and the grid lines are configured to provide gate drive signals to the plurality of subpixels P; the data lines 2 are parallel to a column direction, and each data line 2 is electrically connected with a column of subpixels P; the grid lines are parallel to a row direction, and each grid line is electrically connected with one row of subpixels P.

A first control signal line 4, located in the peripheral region, and surrounding the display region AA.

A second control signal line 5, located in the peripheral region, surrounding the display region AA, and located on a side of the first control signal line 4 away from the display region AA.

A crack detection line D1, located in the peripheral region, and surrounding the display region AA.

At least one data detection line, located in the peripheral region, and surrounding the display region AA; FIG. 1 in the embodiment of the present disclosure being illustrated by taking an example including three data detection lines, which are a first data detection line CTDR, a second data detection line CTDG and a third data detection line CTDB respectively, which will be introduced in detail hereafter.

A plurality of display screen detection elements CT, located in the peripheral region, at least one of the plurality of display screen detection elements CT is electrically connected with the first control signal line 4, the at least one data detection line (CTDR, CTDG or CTDB) and at least one of the plurality of data lines 2, and configured to transmit detection signals provided by the at least one data detection line (CTDR, CTDG or CTDB) to at least one of the plurality of data lines 2 according to a control signal provided by the first control signal line 4.

A plurality of crack detection elements PCD, located in the peripheral region, at least one of the plurality of crack detection elements PCD is electrically connected with the crack detection line D1, the second control signal line 5 and at least one of the plurality of data lines 2; and during crack detection, the crack detection elements PCD is configured to transmit a detection signal provided by the crack detection line D1 to at least one of the plurality of data lines 2 according to a control signal provided by the second control signal line 5.

In some embodiments, at a crack detection stage, the display screen detection elements CT are controlled to be switched off, and the crack detection elements PCD are controlled to work. Since the crack detection line D1 surrounds the display region AA, when display panels are affected by a cutting process and cracks are generated at cutting edges, the crack detection line D1 will be broken, the detection signal on the crack detection line D1 is not transmitted to the crack detection elements PCD, the detection signal on the crack detection line D1 cannot be transmitted to light-emitting elements in the subpixels P connected with the data lines 2, the light-emitting elements connected with the data lines 2 emit light, and bright lines appear in the display region AA; if the crack detection line D1 is not broken, the detection signal on the crack detection line D1 is transmitted to a corresponding data line 2 through the crack detection elements PCD, and output to the light-emitting elements in the subpixels P connected with the data lines 2 through the data lines 2, and the light-emitting elements electrically connected with the data line 2 are in a dark state; and therefore, at least one of the plurality of crack detection elements PCD is electrically connected with the crack detection line D1, the other crack detection elements PCD are not electrically connected with the crack detection line D1, and whether cracks are generated at an edge of the display substrate may be detected. When the plurality of crack detection elements PCD are electrically connected with the crack detection line D1, if the crack detection line D1 is broken, a plurality of bright lines will appear in the display region AA.

It should be noted that in the embodiments of the present disclosure, FIG. 1 is illustrated by taking an example of electrical connection between the two crack detection elements PCD and the crack detection line D1, and FIG. 1 provided by the embodiments of the present disclosure is merely for illustration, which merely illustrates part of the subpixels.

In some embodiments, at a single display screen detection stage, the at least one of the plurality of display screen detection elements CT are controlled to work, the at least one of the plurality of crack detection elements PCD are controlled to be switched off, detection signals on the first data detection line CTDR, the second data detection line CTDG and the third data detection line CTDB are respectively transmitted to the corresponding data lines 2 through the display screen detection elements CT, light-emitting elements in the subpixels P electrically connected with the corresponding data lines 2 emit light, and thus pure color picture detection is performed.

It should be noted that in the embodiments of the present disclosure, at least one crack detection element PCD is adopted to be electrically connected with the crack detection line D1, rather than adopting all the crack detection elements PCD to be electrically connected with the crack detection line D1, when all the crack detection elements PCD are adopted to be electrically connected with the crack detection line D1, if the crack detection line D1 is broken, pixels of the display region AA are all lightened, bright lines caused by some reasons in the display region AA cannot be detected, which affects the reliability of the display substrate, and therefore, in the embodiments of the present disclosure, at least one of the plurality of crack detection elements PCD is electrically connected to the crack detection line D1.

According to the above display substrate provided by the embodiments of the present disclosure, the crack detection elements PCD and the display screen detection elements CT are independent and do not interfere with each other, so that tests of different work stages are not affected; and in addition, under the condition that a drive chip IC does not support bright line detection, a probe may be adopted to access the detection signal from the exterior, that is, bright line detection may still be performed at a module end.

Figure 2:
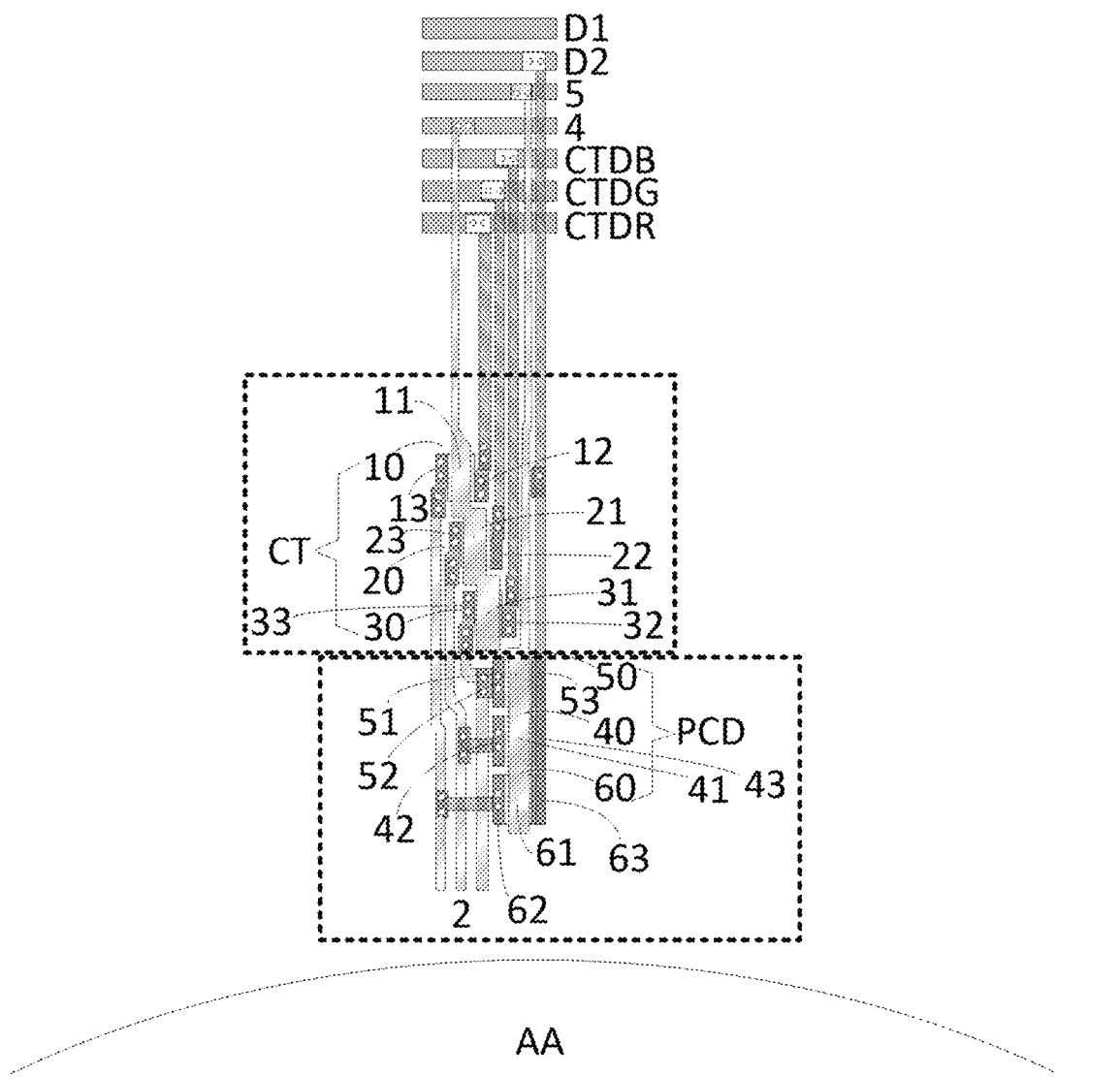
FIG. 2 is a partial cross section schematic structural diagram of a display substrate provided by an embodiment of the present disclosure.
Figure 3:
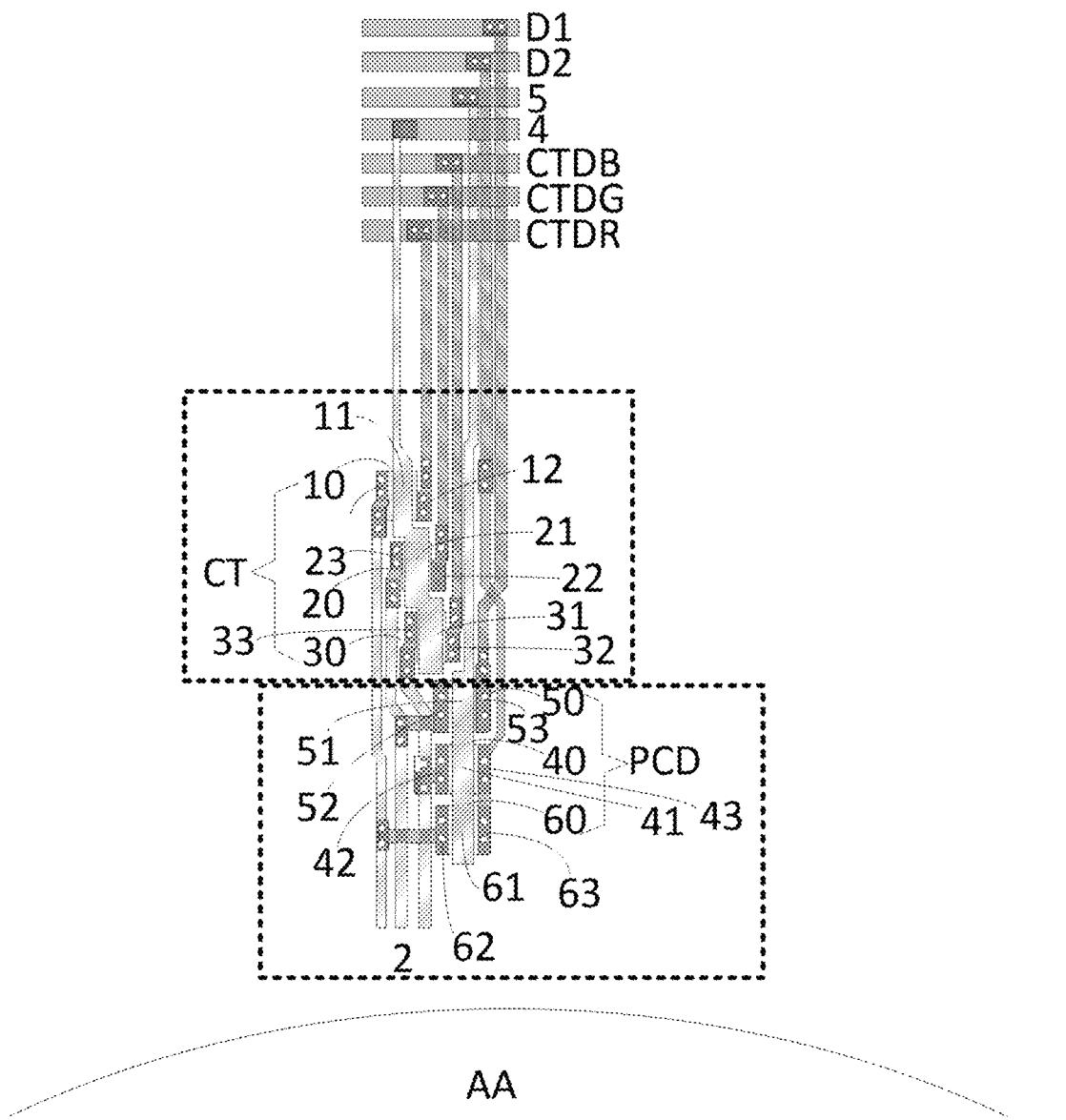
FIG. 3 is another partial cross section schematic structural diagram of a display substrate provided by an embodiment of the present disclosure.

During specific implementation, in the above display substrate provided by the embodiments of the present disclosure, as shown in FIG. 1, FIG. 2 and FIG. 3, FIG. 2 is a schematic structural diagram of a film layer of the PCD and CT in a left dotted line frame in FIG. 1, FIG. 3 is a schematic structural diagram of a film layer of the PCD and CT in a right solid line frame in FIG. 1, the plurality of crack detection elements PCD surround the display region AA, the plurality of display screen detection elements CT surround the display region AA, and the plurality of crack detection elements PCD are located between the plurality of display screen detection elements CT and the display region AA. In this way, the plurality of crack detection elements PCD and the plurality of display screen detection elements CT may independently surround the display region AA, and do not interfere with each other. A difference between FIG. 3 and FIG. 2 is that in FIG. 3, the crack detection elements PCD need to be electrically connected with the crack detection line D1, while in FIG. 2, the crack detection elements PCD are not electrically connected with the crack detection line D1.

It should be noted that FIG. 1 is an equivalent circuit diagram of the equivalent PCD and CT, FIG. 2 and FIG. 3 are layout schematic diagrams of the PCD and CT, the layout in FIG. 2 and FIG. 3 shall prevail in actual production, and FIG. 2 and FIG. 3 illustrate that the plurality of crack detection elements PCD are located between the plurality of display screen detection elements CT and the display region AA; and certainly, during specific production, the plurality of display screen detection elements CT may also be located between the plurality of crack detection elements PCD and the display region AA, and FIG. 1 is merely a schematic diagram as the equivalent circuit, and not as a layout during film layer production.

During specific implementation, in the above display substrate provided by the embodiments of the present disclosure, as shown in FIG. 1 to FIG. 3, the plurality of data lines 2 include a first data line 201, a second data line 202 and a third data line 203, and at least one of the crack detection elements PCD is electrically connected with one of the first data line 201, the second data line 202 and the third data line 203. For example, the crack detection line D1 corresponds to the second data line 202, in this way, when the crack detection line D1 is broken, the second data line 202 corresponding to the crack detection line D1 does not receive the detection signal on the crack detection line D1, the subpixel P column corresponding to the second data line 202 generates a bright line, however, the subpixel P column corresponding to the first data line 201 and the third data line 203 is in a dark state, so that crack detection may be performed.

During specific implementation, the above display substrate provided by the embodiments of the present disclosure, as shown in FIG. 1 to FIG. 3, further includes a test line D2 located in the peripheral region, the test line D2 is located between the crack detection line D1 and the second control signal line 5, and at least one of the crack detection elements PCD is electrically connected with the crack detection line D1, the test line D2, the second control signal line 5, the first data line 201, the second data line 202 and the third data line 203; and the other crack detection elements PCD are electrically connected with the test line D2, the second control signal line 5, the first data line 201, the second data line 202 and the third data line 203.

The crack detection elements PCD are further configured to transmit a test signal provided by the test line D2 to at least one of the plurality of data lines 2 according to the control signal provided by the second control signal line 5. For example, the crack detection line D1 corresponds to the second data line 202, in this way, when the crack detection line D1 is broken, the second data line 202 corresponding to the crack detection line D1 does not receive the detection signal on the crack detection line D1, the subpixel P column corresponding to the second data line 202 generates a bright line, however, the first data line 201 and the third data line 203 correspondingly receive the test signal on the test line D2, the test signal controls the subpixel P column corresponding to the first data line 201 and the third data line 203 to be in a dark state, and thus crack detection may be performed.

During specific implementation, in the above display substrate provided by the embodiments of the present disclosure, as shown in FIG. 1 to FIG. 3, at least one data detection line includes a first data detection line CTDR, a second data detection line CTDG and a third data detection line CTDB, the first data detection line CTDR is closest to the display region AA, the second data detection line CTDG is located between the crack detection line D1 and the first data detection line CTDR, and the third data detection line CTDB is located between the crack detection line D1 and the second data detection line CTDG; and at least one of the plurality of display screen detection elements CT is electrically connected with one of the first data detection line CTDR, the second data detection line CTDG and the third data detection line CTDB.

The display screen detection elements CT are configured to transmit detection signals provided by the first data detection line CTDR, the second data detection line CTDG and the third data detection line CTDB to the corresponding data lines 2 according to the control signal provided by the first control signal line 4. In this way, during single display screen detection, the crack detection elements PCD are controlled not to work, and the control signal provided by the first control signal line 4 controls the display screen detection elements CT to work, so that the detection signals provided by the first data detection line CTDR, the second data detection line CTDG and the third data detection line CTDB are respectively transmitted to a corresponding data line 2, and thus pure color picture detection is achieved.

During specific implementation, in the above display substrate provided by the embodiments of the present disclosure, as shown in FIG. 1 to FIG. 3, at least one of the display screen detection elements CT is electrically connected with the first data detection line CTDR, the second data detection line CTDG and the third data detection line CTDB. In this way, during pure color picture detection, the detection signal provided by the first data detection line CTDR may control a display panel to display a red picture, the detection signal provided by the second data detection line CTDG may control the display panel to display a green picture, and the detection signal provided by the third data detection line CTDB may control the display panel to display a blue picture.

It should be noted that in the embodiments of the present disclosure, illustration is performed by taking an example that the plurality of display screen detection elements CT are all electrically connected with the corresponding data detection lines (the first data detection line CTDR, the second data detection line CTDG and the third data detection line CTDB), and in this way, a detection effect of pure color pictures may be better.

During specific implementation, the above display substrate provided by the embodiments of the present disclosure, as shown in FIG. 1, further includes a plurality of bonding pads 3 located in the peripheral region; the plurality of display screen detection elements CT are located at opposite sides of the plurality of binding bonding pads 3, that is, the plurality of display screen detection elements CT and the plurality of binding bonding pads 3 are located at opposite sides of the display region AA; and the plurality of crack detection elements PCD are located at opposite sides of the plurality of binding bonding pads 3, that is, the plurality of crack detection elements PCD and the plurality of binding bonding pads 3 are located at opposite sides of the display region AA. The bonding pads 3 are of a structure arranged on the substrate 1 and used for obtaining signals, and may be a layer or a plurality of layers of sheet-like metal layers arranged on the substrate 1; for example, the bonding pads 3 may be a structure (such as a Pin) for bonding connection with a flexible printed circuit (FPC) or a drive chip (IC), and thus signals from the flexible printed circuit or the drive chip may be obtained; and in addition, at least part of the bonding pads 3 are used for providing data signals for the data lines 2, that is, the at least part of the bonding pads 3 are used for providing the data signals for the data lines 2 during displaying, so as to control the subpixels P connected to the data lines 2 to display required contents.

During specific implementation, the above display substrate provided by the embodiments of the present disclosure, as shown in FIG. 1, further includes a plurality of bonding pads 3 located in the peripheral region, and the crack detection line D1 and the test line D2 are led out from the same bonding pad 3.

During specific implementation, in the above display substrate provided by the embodiments of the present disclosure, as shown in FIG. 1, the test line D2 is directly arranged to surround the display region AA after being led out from bonding pad 3, and the crack detection line D1 surrounds the display region AA after being led out from the bonding pad 3. In this way, when an edge of the display substrate generates cracks due to cutting, the crack detection line D1 surrounding the display region AA will be broken, however, the detection signal on the crack detection line D1 cannot be transmitted to the display region AA, so that a bright line will appear to the display region AA.

During specific implementation, in the above display substrate provided by the embodiments of the present disclosure, as shown in FIG. 1, the second control signal line 5, the at least one data detection line (the first data detection line CTDR, the second data detection line CTDG and the third data detection line CTDB) and the first control signal line 4 are all led out from the corresponding bonding pads 3 and surround the display region AA, and a position relationship of these signal lines has been described above, which is not repeated here.

During specific implementation, in the above display substrate provided by the embodiments of the present disclosure, as shown in FIG. 2 and FIG. 3, in a direction of the display region AA pointing to the peripheral region, the at least one data detection line (the first data detection line CTDR, the second data detection line CTDG and the third data detection line CTDB in sequence), the first control signal line 4, the second control signal line 5, the test line D2 and the crack detection line D1 are sequentially arranged, and a position relationship of these signal lines has been described above, which is not repeated here. Certainly, during specific implementation, a wiring mode of other arrangements may also be adopted, which belongs to the protection scope of the prevent disclosure.

During specific implementation, in the above display substrate provided by the embodiments of the present disclosure, as shown in FIG. 1 to FIG. 3, at least one of the display screen detection elements CT at least includes a first transistor 10, a second transistor 20 and a third transistor 30.

A control electrode 11 of the first transistor 10, a control electrode 21 of the second transistor 20 and a control electrode 31 of the third transistor 30 are all electrically connected with the first control signal line 4;

a first electrode 12 of the first transistor 10 is electrically connected with the first data detection line CTDR, a first electrode 22 of the second transistor 20 is electrically connected with the second data detection line CTDG, and a first electrode 32 of the third transistor 30 is electrically connected with the third data detection line CTDB; and a second electrode 13 of the first transistor 10, a second electrode 23 of the second transistor and a second electrode 33 of the third transistor 30 are electrically connected to a respective one of the plurality of data lines 2 respectively.

During specific implementation, in the above display substrate provided by the embodiments of the present disclosure, as shown in FIG. 1 to FIG. 3, at least one of the crack detection elements PCD at least includes a first transistor 40, a second transistor 50 and a third transistor 60.

A control electrode 41 of the first transistor 40, a control electrode 51 of the second transistor 50 and a control electrode 61 of the third transistor 60 in each crack detection element PCD are all electrically connected with the second control signal line 5;

a first electrode 42 of the first transistor 40, a first electrode 52 of the second transistor 50 and a first electrode 62 of the third transistor 60 in each crack detection element PCD are electrically connected with a respective one of the plurality of data lines 2 respectively; and a second electrode 53 of the second transistor 50 in the at least one of the crack detection elements PCD is electrically connected with the crack detection line D1, and a second electrode 43 of the first transistor 40 and a second electrode 63 of the third transistor 60 are electrically connected with the test line D2, and FIG. 1 illustrates that second electrodes 53 of second transistors 50 in two crack detection elements PCD are electrically connected with the crack detection line D1; and second electrodes 43 of first transistors 40, second electrodes 53 of second transistors 50 and second electrodes 63 of the third transistors 60 in the other crack detection elements PCD are all electrically connected with the test line D2.

In some embodiments, all the switching transistors are P-type switching transistors, FIG. 2 is a layout schematic diagram during CT detection, during CT detection, the first control signal line 4 provides a low level signal, the transistors of the display screen detection elements CT are switched on, and the second control signal line 5 provides a high level signal, the transistors of the crack detection elements PCD are switched off, which does not affect CT detection. FIG. 3 is a layout schematic diagram during PCD detection, during crack detection, namely, bright line detection, the first control signal line 4 provides a high level signal, the transistors of the display screen detection elements CT are switched off, the second control signal line 5 provides a low level signal, the transistors of the crack detection elements PCD are switched on, when cracks are generated at the edge of the screen, a signal on the test line D2 output by the crack detection elements PCD in FIG. 2 enables the controlled subpixels to be in a dark state, the subpixel (R) and subpixel (B) controlled by the crack detection elements PCD in FIG. 3 are controlled by the test signal on the test line D2 to be in a dark state, the subpixel (G) is controlled by the detection signal on the crack detection line D1 to emit light, and therefore, when cracks are generated at the edge of the screen, an apparent green line will appear. During module end detection, namely at a bonding drive chip IC stage, all signals are input by the IC in the module end.

It should be explained that as shown in FIG. 1 to FIG. 3, the subpixel corresponding to the second transistor 20 electrically connected with the second data detection line CTDG is a green subpixel (G), however, the first electrode 52 of the second transistor 50 in the at least one of the crack detection elements PCD electrically connected with the crack detection line D1 is electrically connected with a green subpixel (G) column, that is, when cracks appear, a green bright line will appear in the display region AA, the crack detection line D1 adopts electrical connection with the green subpixel (G) column due to the fact that human eyes are relatively sensitive to green, and certainly, the first electrode of the second transistor 50 in the at least one of the crack detection elements PCD electrically connected with the crack detection line D1 in the crack detection element PCD may also be electrically connected with a red subpixel (R) column or a blue subpixel (B) column.

Therefore, according to the display substrate provided by the embodiments of the present disclosure, the PCD and CT elements are independent and do not interfere with each other, and the PCD for bright line detection at the module end is supported.

According to the display substrate provided by the embodiments of the present disclosure, the crack detection elements PCD and the display screen detection elements CT are two independent structures and located in the same element, and crack detection and pure color picture detection do not interfere with each other. During specific implementation, in the above display substrate provided by the embodiment of the present disclosure, as shown in FIG. 1, the crack detection line D1 and the test line D2 are led out from the same bonding pad 3, that is, the detection signal on the crack detection line D1 and the test signal on the test line D2 are the same signal, for example, if a signal is output by the drive chip IC of a bonding region at the module end, and directly enters the detection element through a wire, then the signal is the test signal on the test line D2; and if a signal is output by the drive chip IC of the bonding region at the module end and wound at the edge of the display substrate, and then enters the detection element, then the signal is the detection signal on the crack detection line D1. During detection, data signals of only several columns of subpixels P are controlled by the crack detection elements PCD for input, and data signals of the other columns of subpixels P are controlled by the display screen detection elements CT for input.

In some embodiments, the above transistors are all thin film transistors (TFTs), if first electrodes of the thin film transistors are source electrodes of the thin film transistors, second electrodes of the transistors are drain electrodes of the thin film transistors; and if first electrodes of the transistors are drain electrodes of the thin film transistors, second electrodes of the transistors are source electrodes of the thin film transistors.

As shown in FIG. 1, the first transistor to third transistor in at least one of the display screen detection elements CT and the first transistor to the third transistor in the at least one of the crack detection elements PCD are all P-type transistors, and certainly, may also be N-type transistors.

Those skilled in the art should understand that the crack detection elements PCD and the display screen detection elements CT provided in FIG. 1 in the embodiments of the present disclosure are examples, when the transistors are all P-type transistors or the N-type transistors or the first electrodes and the second electrodes of the transistors are respectively different electrodes of the transistors, an electrical connection mode of elements in the crack detection elements PCD and the display screen detection elements CT provided by the embodiments of the present disclosure may be adaptably adjusted, and the adaptably adjusted electrical connection mode still belongs to the protection scope of the embodiments of the present disclosure.

Based on the same inventive concept, the embodiments of the present disclosure further provides a detection method of the above display substrate, as shown in FIG. 4, including following steps.

S401, at a crack detection stage of the display substrate: a first control signal line receives a first level signal, to control the at least one of the plurality of display screen detection elements to be switched off; a second control signal line receives a second level signal, to control the at least one of the plurality of crack detection elements to be switched on; if a crack detection line is not broken, a detection signal on the crack detection line is transmitted to a corresponding data line through the at least one of the plurality of crack detection elements and output to light-emitting elements in subpixels connected with the corresponding data line through the corresponding data line, and the light-emitting elements electrically connected with the data lines are in a dark state; and if the crack detection line is broken, the detection signal on the crack detection line cannot be transmitted to the light-emitting elements in the subpixels, and the light-emitting elements electrically connected with the corresponding data line emit light.

S402, at a display screen detection stage: the first control signal line receives the second level signal, to control the at least one of the plurality of display screen detection elements to be switched on; the second control signal line receives the first level signal, to control the at least one of the plurality of crack detection elements to be switched off; and a detection signal of at least one data detection line is transmitted to the corresponding data line through the at least one of the plurality of display screen detection elements, and the light-emitting elements in the subpixels electrically connected with the data lines emit light.

According to the detection method of the above display substrate provided by the embodiments of the present disclosure, the crack detection elements and the display screen detection elements are independent and do not interfere with each other, which do not affect testing of different work stages; and in addition, under the condition that a drive chip does not support bright line detection, a probe may be adopted to access the detection signals from an exterior, that is, bright line detection may be performed at the module end.

Based on the same inventive concept, the embodiments of the present disclosure further provide a display apparatus, including the above display substrate provided by the embodiments of the present disclosure. The display apparatus may be a mobile phone, a tablet personnel computer, a television, a display, a notebook computer, a digital photo frame, a navigator and any products or components with display functions. The implementation of the display apparatus may refer to the embodiments of the above display substrate, and the repetition is omitted. Other essential constituent parts of the display apparatus should be understood by those of ordinary skill in the art, which is not repeated here, and should not limit the present disclosure.

During specific implementation, the display apparatus provided by the embodiments of the present disclosure may be a watch and other wearable display products.

According to the above display substrate and the detection method therefor, and the display apparatus provided by the embodiments of the present disclosure, the crack detection elements PCD and the display screen detection elements CT are independent and do not interfere with each other, which do not affect testing of different work stages; and in addition, under the condition that the drive chip IC does not support bright line detection, the probe may be adopted to access the detection signals from the exterior, that is, bright line detection may be performed at the module end.

Although the preferred embodiments of the present disclosure have been described, those skilled in the art may make additional variations and modifications to the embodiments of the present disclosure once they know the basic creative concept. Therefore, the appended claims are intended to include the preferred embodiments and all variations and modifications falling within the scope of the present disclosure.

Apparently, those skilled in the art may make various changes and variations to the embodiments of the present disclosure without departing from the spirit and scope of the present disclosure. In this case, if these changes and variations of the present disclosure fall within the scope of the claims of the present disclosure and their equivalents, the present disclosure also intends to contain these changes and variations.

What is claimed is:

1. A display substrate, comprising:
a substrate, comprising a display region and a peripheral region surrounding the display region;
a plurality of subpixels, located in the display region;
a plurality of data lines, located in the display region, and electrically connected with the plurality of subpixels;
a first control signal line, located in the peripheral region;
a second control signal line, located in the peripheral region;
a crack detection line, located in the peripheral region, and arranged to surround the display region;
at least one data detection line, located in the peripheral region;
a plurality of display screen detection elements, located in the peripheral region, wherein at least one of the plurality of display screen detection elements is electrically connected with the first control signal line, the at least one data detection line and at least one of the plurality of data lines, and configured to transmit a detection signal provided by the at least one data detection line to at least one of the plurality of data lines according to a control signal provided by the first control signal line; and
a plurality of crack detection elements, located in the peripheral region, wherein at least one of the plurality of crack detection elements is electrically connected with the crack detection line, the second control signal line and at least one of the plurality of data lines;
wherein the first control signal line, the second control signal line and the at least one data detection line are all arranged to surround the display region;
wherein the plurality of data lines comprise a first data line, a second data line and a third data line, and at least one of the plurality of crack detection elements is electrically connected with one of the first data line, the second data line and the third data line;
wherein the display substrate further comprises: a test line located in the pheripheral region, wherein at least one of the plurality of crack detection elements is electrically connected with the crack detection line, the test line, the second control signal line, the first data line, the second data line and the third data line; and the at least one of plurality of crack detection elements is configured to transmit a test signal provided by the test line to at least plurality of data lines according to a control signal provided by the second control signal line;
wherein at least one of the plurality of crack detection elements at least comprises a first transistor, a second transistor and a third transistor;
a control electrode of the first transistor, a control electrode of the second transistor and a control electrode of the third transistor are all electrically connected with the second control signal line;
a first electrode of the first transistor, a first electrode of the second transistor and a first electrode of the third transistor are electrically connected with a respective one of the plurality of data lines respectively; and
a second electrode of the second transistor in the at least one of the plurality of crack detection elements is electrically connected with the crack detection line, and a second electrode of the first transistor and a second electrode of the third transistor are electrically connected with the test line; and second electrodes of first transistors, second electrodes of second transistors and second electrodes of third transistors in the remaining crack detection elements are all electrically connected with the test line.

2. The display substrate according to claim 1, wherein the at least one data detection line comprises a first data detection line, a second data detection line and a third data detection line, and at least one of the plurality of display screen detection elements is electrically connected with at least one of the first data detection line, the second data detection line and the third data detection line; and the at least one of plurality of display screen detection elements are configured to transmit detection signals provided by the first data detection line, the second data detection line or the third data detection line to a corresponding data line according to a control signal provided by the first control signal line.

3. The display substrate according to claim 2, wherein at least one of the plurality of display screen detection elements is electrically connected with the first data detection line, the second data detection line and the third data detection line.

4. The display substrate according to claim 3, wherein at least one of the plurality of display screen detection elements comprises a first transistor, a second transistor and a third transistor;

a control electrode of the first transistor, a control electrode of the second transistor and a control electrode of the third transistor are all electrically connected with the first control signal line;

a first electrode of the first transistor is electrically connected with the first data detection line, a first electrode of the second transistor is electrically connected with the second data detection line, and a first electrode of the third transistor is electrically connected with the third data detection line; and a second electrode of the first transistor, a second electrode of the second transistor and a second electrode of the third transistor are electrically connected with a respective one of the plurality of data lines respectively.

5. The display substrate according to claim 1, further comprising a plurality of bonding pads located in the peripheral region;

wherein the plurality of display screen detection elements are located at opposite sides of the plurality of bonding pads, and the plurality of display screen detection elements and the plurality of bonding pads are located at opposite sides of the display region; and the plurality of crack detection elements are located at the opposite sides of the plurality of bonding pads, and the plurality of crack detection elements and the plurality of bonding pads are located at opposite sides of the display region.

6. The display substrate according to claim 5, wherein the plurality of crack detection elements are arranged to surround the display region, the plurality of display screen detection elements surround the display region, and the plurality of crack detection elements are located between the plurality of display screen detection elements and the display region.

7. The display substrate according to claim 5, wherein the second control signal line, the at least one data detection line and the first control signal line are led out from a respective one of the bonding pads respectively and are arranged to surround the display region.

8. The display substrate according to claim 1, further comprising a plurality of bonding pads located in the peripheral region, wherein the crack detection line and the test line are led out from a same bonding pad.

9. The display substrate according to claim 8, wherein the test line is arranged to surround the display region after being led out from the bonding pad, and the crack detection line surrounds the display region along an edge of the display substrate after being led out from the bonding pad.

10. The display substrate according to claim 1, wherein in a direction of the display region pointing to the peripheral region, the at least one data detection line, the first control signal line, the second control signal line, the test line and the crack detection line are sequentially arranged.

11. A display apparatus, comprising the display substrate according to claim 1.

12. A detection method of a display substrate, wherein the method comprises:

at a crack detection stage of the display substrate: receiving, by a first control signal line, a first level signal, to control at least one of a plurality of display screen detection elements to be switched off; receiving, by a second control signal line, a second level signal, to control at least one of a plurality of crack detection elements to be switched on; if a crack detection line is not broken, transmitting a detection signal on the crack detection line to a corresponding data line through the at least one of the plurality of crack detection elements, and outputting the detection signal to light-emitting elements in subpixels connected with the corresponding data line through the corresponding data line, so that the light-emitting elements electrically connected with the corresponding data line are in a dark state; and if the crack detection line is broken, not transmitting the detection signal on the crack detection line to the light-emitting elements in the subpixels, so that the light-emitting elements electrically connected with the corresponding data line emit light; and at a display screen detection stage: receiving, by the first control signal line, the second level signal, to control the at least one of the plurality of display screen detection elements to be switched on; receiving, by the second control signal line, the first level signal, to control the at least one of the plurality of crack detection elements to be switched off; and transmitting the detection signal of the at least one data detection line to the corresponding data line through the at least one of the plurality of display screen detection elements, so that the light-emitting elements in the subpixels electrically connected with the data lines emit light.

* * * * *